US012701796B2

(12) United States Patent
Guo et al.

(10) Patent No.: US 12,701,796 B2
(45) Date of Patent: Aug. 4, 2026

(54) SILICON PHOTOMULTIPLIER TUBE

(71) Applicant: Shanghai Huali Microelectronics Corporation, Shanghai (CN)

(72) Inventors: Zhao Guo, Shanghai (CN); Chengdong Liang, Shanghai (CN); Liangliang He, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 356 days.

(21) Appl. No.: 18/632,404

(22) Filed: Apr. 11, 2024

(65) Prior Publication Data

US 2025/0098338 A1 Mar. 20, 2025

(30) Foreign Application Priority Data

Sep. 15, 2023 (CN) .......................... 202311196022.5

(51) Int. Cl.
H10F 30/225 (2025.01)
H10F 77/00 (2025.01)

(52) U.S. Cl.
CPC ......... H10F 30/225 (2025.01); H10F 77/959 (2025.01)

(58) Field of Classification Search
CPC .... H10F 30/225; H10F 77/959; H10F 77/206; Y02D 30/70
See application file for complete search history.

(56) References Cited

U.S. PATENT DOCUMENTS

2009/0309648 A1* 12/2009 Zheng ....................... G01J 1/42
                                                          257/438
2012/0267746 A1* 10/2012 Sanfilippo ............. H10F 39/107
                                                          438/73

* cited by examiner

*Primary Examiner* — Jonathan Han
(74) *Attorney, Agent, or Firm* — Banner & Witcoff, Ltd.

(57) ABSTRACT
This application discloses a unit structure of a silicon photomultiplier tube, including a first conductive type heavily doped first electrode region located on a first side of the shallow trench isolation, a second conductive type heavily doped second electrode region located on a second side, and a quenching resistor located on a top surface of the shallow trench isolation. A photosensitive layer is formed in the silicon substrate at bottoms of the first electrode region, the shallow trench isolation and the second electrode region. The first electrode region, the photosensitive layer and the second electrode region form a Geiger mode avalanche photodiode. A first end of the quenching resistor is connected to the first electrode region through a first metal interconnect structure. A second end of the quenching resistor is connected to a first electrode. The second electrode region is connected to a second electrode.

11 Claims, 2 Drawing Sheets

SILICON PHOTOMULTIPLIER TUBE

CROSS-REFERENCE TO RELATED APPLICATIONS

This application claims the priority to Chinese patent application No. 202311196022.5, filed on Sep. 15, 2023, the disclosure of which is incorporated herein by reference in its entirety.

TECHNICAL FIELD

This application relates to a semiconductor integrated circuit, in particular to a silicon photomultiplier tube (SiPM).

BACKGROUND

The demand for photomultiplier tubes is high. Compared with traditional photomultiplier tubes (PMTs), silicon photomultiplier tubes have lower costs, higher integration, and greater market competitiveness.

In the existing silicon photomultiplier tube, an electrode is usually set on each of the front side and back side of the silicon substrate, and the quenching resistor needs to occupy additional area, which influences the cost and photon detection efficiency of the existing silicon photomultiplier tube.

BRIEF SUMMARY

According to some embodiments in this application, each unit structure of the silicon photomultiplier tube disclosed in this application includes:

a silicon substrate;

a shallow trench isolation formed on the silicon substrate;

a first electrode region heavily doped in a first conductive type located on a surface of the silicon substrate on a first side of the shallow trench isolation;

a second electrode region heavily doped in a second conductive type located on a surface of the silicon substrate on a second side of the shallow trench isolation; and a quenching resistor located on a top surface of the shallow trench isolation;

a photosensitive layer is formed in the silicon substrate at a bottom of the first electrode region;

the first electrode region, the photosensitive layer and the second electrode region form a Geiger mode avalanche photodiode;

a first end of the quenching resistor is connected to the first electrode region through a first metal interconnect structure;

a second end of the quenching resistor is connected to a first electrode;

the second electrode region is connected to a second electrode;

the first electrode and the second electrode are both located on a front side of the silicon substrate, and photons enter the photosensitive layer from a front side of the first electrode region to achieve photo sensing.

In some cases, a silicon epitaxial layer is further formed on the silicon substrate, and the photosensitive layer, the first electrode region, the shallow trench isolation and the second electrode region are all formed in the silicon epitaxial layer.

In some cases, the photosensitive layer includes a deep photodiode region of the first conductive type;

the first electrode region is located in a surface region of the deep photodiode region;

the deep photodiode region is located in a deep well region of the second conductive type;

a unit well region of the second conductive type is located in the deep well region, and the second electrode region is located in a surface region of the unit well region;

the deep photodiode region and the unit well region are in contact or have spacing on a bottom side of the shallow trench isolation.

In some cases, the first conductive type is N-type, and the second conductive type is P-type; or the first conductive type is P-type, and the second conductive type is N-type.

In some cases, the quenching resistor is composed of polysilicon resistors.

In some cases, the first metal interconnect structure includes a first contact formed in a top of the first end of the quenching resistor, a second contact formed in a top of the first electrode region, and a first metal wire connecting the first contact and the second contact.

In some cases, the deep photodiode region, the deep well region and the unit well region are all formed through ion implantation.

In some cases, the silicon photomultiplier tube is composed of a plurality of unit structures connected in parallel;

the first electrodes of all unit structures are connected together, and the second electrodes of all unit structures are connected together.

In some cases, the voltage between the first electrode and the second electrode is tens of volts.

In some cases, the number of unit structures connected in parallel in the silicon photomultiplier tube ranges from tens to tens of thousands.

In some cases, the resistance of the quenching resistor ranges from tens of Ω to thousands of Ω.

In this application, a special arrangement is made for each unit structure of the silicon photomultiplier tube. By respectively arranging the first electrode region and the second electrode region on two sides of the shallow trench isolation, and arranging the quenching resistor on the top surface of the shallow trench isolation, since the quenching resistor is located on the top surface of the shallow trench isolation, the quenching resistor does not need to occupy additional chip area, thus reducing the area, improving the integration, and reducing the cost.

In this application, the photosensitive layer is located in the bottom region directly below the first electrode region, and the photosensitive area can be changed by controlling the size of the first electrode region, thus controlling the photon detection efficiency.

BRIEF DESCRIPTION OF THE DRAWINGS

This application will be further described below in detail in combination with the specific embodiments with reference to the drawings.

DETAILED DESCRIPTION OF THE EMBODIMENTS

Figure 1:
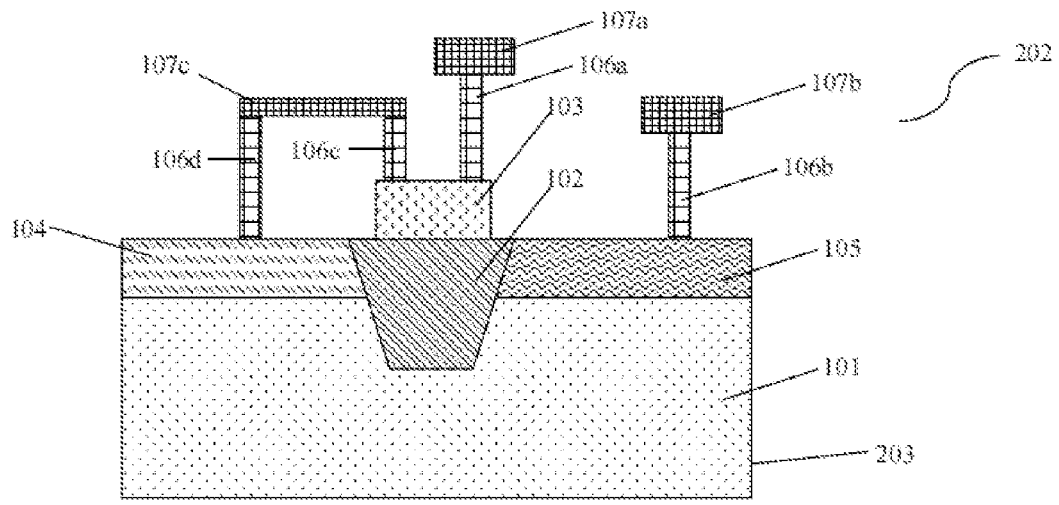
FIG. 1 illustrates a schematic diagram of a unit structure of a silicon photomultiplier tube according to an embodiment of this application.
Figure 2:
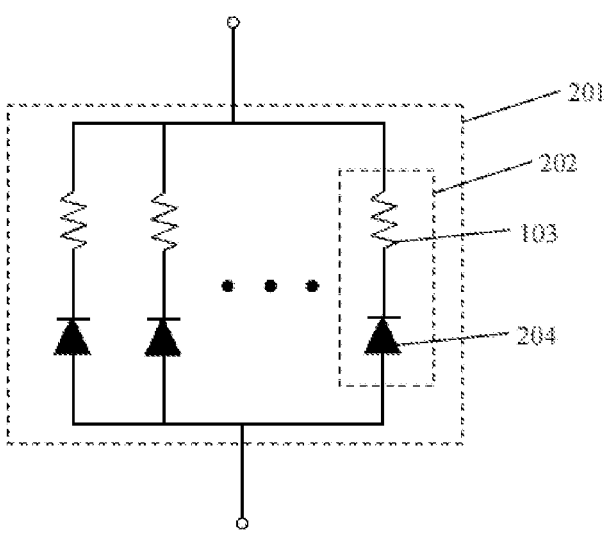
FIG. 2 illustrates a circuit diagram of a silicon photomultiplier tube according to an embodiment of this application.

Referring to FIG. 1, it illustrates a schematic diagram of a unit structure of a silicon photomultiplier tube according to an embodiment of this application. Referring to FIG. 2, it illustrates a circuit diagram of a silicon photomultiplier tube according to an embodiment of this application. Each unit structure 202 of the silicon photomultiplier tube according to this embodiment of this application includes:

a silicon substrate 203;

a shallow trench isolation 102 formed on the silicon substrate 203;

a first electrode region 104 heavily doped in a first conductive type located on a surface of the silicon substrate 203 on a first side of the shallow trench isolation 102;

a second electrode region 105 heavily doped in a second conductive type located on a surface of the silicon substrate 203 on a second side of the shallow trench isolation 102; and a quenching resistor 103 located on a top surface of the shallow trench isolation 102.

In this embodiment of this application, the quenching resistor 103 is composed of polysilicon resistors.

A photosensitive layer is formed in the silicon substrate 203 at a bottom of the first electrode region 104.

The first electrode region 104, the photosensitive layer and the second electrode region 105 form a Geiger mode avalanche photodiode 204. For the circuit structure of the Geiger mode avalanche photodiode 204, please refer to FIG. 2. In FIG. 1, the photosensitive layer is a part of a depletion layer 101 located between the first electrode region 104 and the second electrode region 105, i.e., a part directly below the first electrode region 104.

A first end of the quenching resistor 103 is connected to the first electrode region 104 through a first metal interconnect structure.

In this embodiment of this application, the first metal interconnect structure includes a first contact 106c formed in a top of the first end of the quenching resistor 103, a second contact 106d formed in a top of the first electrode region 104, and a first metal wire 107c connecting the first contact 106c and the second contact 106d. The first metal wire 107c is formed by patterning a front side metal layer.

A second end of the quenching resistor 103 is connected to a first electrode 107a.

In this embodiment of this application, the second end of the quenching resistor 103 is connected to a first electrode 107a through a contact 106a in the top, and the first electrode 107a is formed by patterning the front side metal layer.

The second electrode region 105 is connected to a second electrode 107b.

In this embodiment of this application, the second electrode region 105 is connected to a second electrode 107b through a contact 106b in the top, and the second electrode 107b is formed by patterning the front side metal layer.

The first electrode 107a and the second electrode 107b are both located on a front side of the silicon substrate 203, and photons enter the photosensitive layer from a front side of the first electrode region 104 to achieve photo sensing.

In this embodiment of this application, a silicon epitaxial layer is further formed on the silicon substrate 203, and the photosensitive layer, the first electrode region 104, the shallow trench isolation 102, and the second electrode region 105 are all formed in the silicon epitaxial layer. The regions illustrated in FIG. 1 are all within the thickness range of the silicon epitaxial layer.

Referring to FIG. 2, in this embodiment of this application, the silicon photomultiplier tube 201 is composed of a plurality of unit structures 202 connected in parallel.

The first electrodes 107a of all unit structures 202 are connected together, and the second electrodes 107b of all unit structures 202 are connected together.

The voltage between the first electrode 107a and the second electrode 107b is tens of volts.

The number of unit structures 202 connected in parallel in the silicon photomultiplier tube 201 ranges from tens to tens of thousands.

The resistance of the quenching resistor 103 ranges from tens of Ω to thousands of Ω.

In this embodiment of this application, the first conductive type is N-type, and the second conductive type is P-type. In other embodiments, the first conductive type may be P-type, and the second conductive type may be N-type.

In this embodiment of this application, a special arrangement is made for each unit structure 202 of the silicon photomultiplier tube 201. By respectively arranging the first electrode region 104 and the second electrode region 105 on two sides of the shallow trench isolation 102, and arranging the quenching resistor 103 on the top surface of the shallow trench isolation 102, since the quenching resistor 103 is located on the top surface of the shallow trench isolation 102, the quenching resistor 103 does not need to occupy additional chip area, thus reducing the area, improving the integration, and reducing the cost.

In this embodiment of this application, the photosensitive layer is located in the bottom region directly below the first electrode region 104, and the photosensitive area can be changed by controlling the size of the first electrode region 104, thus controlling the photon detection efficiency.

Figure 3:
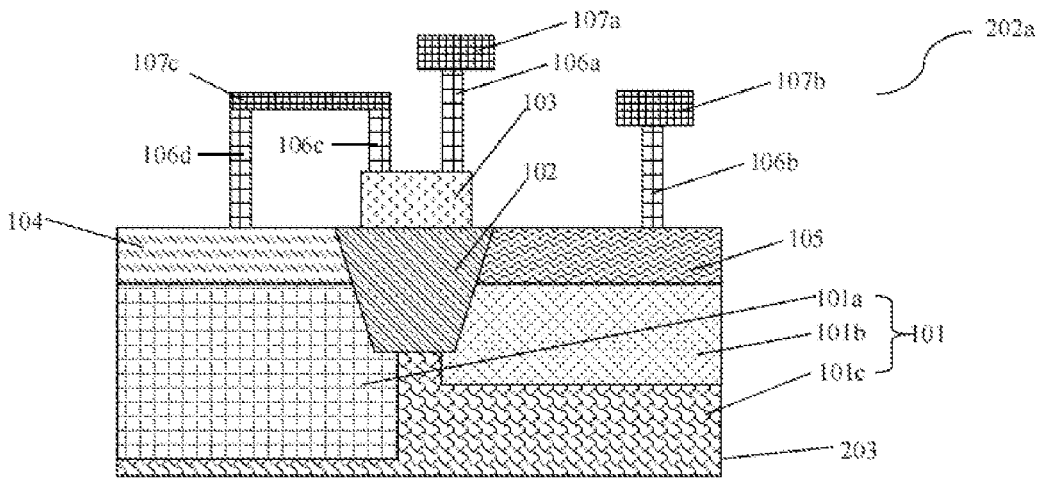
FIG. 3 illustrates a schematic diagram of a unit structure of a silicon photomultiplier tube according to an exemplary embodiment of this application.

Referring to FIG. 3, it illustrates a schematic diagram of a unit structure 202a of a silicon photomultiplier tube according to an exemplary embodiment of this application. In this exemplary embodiment of this application, the photosensitive layer includes a deep photodiode region 101a of the first conductive type.

The first electrode region 104 is located in a surface region of the deep photodiode region 101a.

The deep photodiode region 101a is located in a deep well region 101c of the second conductive type.

A unit well region 101b of the second conductive type is located in the deep well region 101c, and the second electrode region 105 is located in a surface region of the unit well region 101b.

In FIG. 2, a depletion layer 101 located between the first electrode region 104 and the second electrode region 105 is composed of the deep photodiode region 101a, the unit well region 101b, and the deep well region 101c, and only the deep photodiode region 101a is used for photo sensing.

In a case that the first conductive type is N-type and the second conductive type is P-type, the N-type deep photodiode region 101a is referred to as DNPPD, the P-type deep well region 101c is referred to as DPW, and the P-type unit well region 101b is referred to as CPW.

The deep photodiode region 101a and the unit well region 101b are in contact or have spacing on a bottom side of the shallow trench isolation 102.

The deep photodiode region 101a, the deep well region 101c and the unit well region 101b are all formed through ion implantation.

This application is described above in detail through the specific embodiments, which, however, do not constitute limitations to this application. Without departing from the principle of this application, those skilled in the art may also make many modifications and improvements, which should also be considered as included in the scope of protection of this application.

What is claimed is:

1. A silicon photomultiplier tube, wherein each unit structure comprises:

a silicon substrate;

a shallow trench isolation formed on the silicon substrate;

a first electrode region heavily doped in a first conductive type located on a surface of the silicon substrate on a first side of the shallow trench isolation;

a second electrode region heavily doped in a second conductive type located on a surface of the silicon substrate on a second side of the shallow trench isolation; and a quenching resistor located on a top surface of the shallow trench isolation, a photosensitive layer is formed in the silicon substrate at a bottom of the first electrode region, the first electrode region, the photosensitive layer, and the second electrode region form a Geiger mode avalanche photodiode, a first end of the quenching resistor is connected to the first electrode region through a first metal interconnect structure, a second end of the quenching resistor is connected to a first electrode, the second electrode region is connected to a second electrode, the first electrode and the second electrode are both located on a front side of the silicon substrate, and photons enter the photosensitive layer from a front side of the first electrode region to achieve photo sensing.

2. The silicon photomultiplier tube according to claim 1, wherein a silicon epitaxial layer is further formed on the silicon substrate, and the photosensitive layer, the first electrode region, the shallow trench isolation, and the second electrode region are all formed in the silicon epitaxial layer.

3. The silicon photomultiplier tube according to claim 2, wherein the photosensitive layer comprises a deep photodiode region of the first conductive type;

the first electrode region is located in a surface region of the deep photodiode region;

the deep photodiode region is located in a deep well region of the second conductive type;

a unit well region of the second conductive type is located in the deep well region, and the second electrode region is located in a surface region of the unit well region; and the deep photodiode region and the unit well region are in contact or have spacing on a bottom side of the shallow trench isolation.

4. The silicon photomultiplier tube according to claim 3, wherein the first conductive type is N-type, and the second conductive type is P-type; or the first conductive type is P-type, and the second conductive type is N-type.

5. The silicon photomultiplier tube according to claim 4, wherein the silicon photomultiplier tube is composed of a plurality of unit structures connected in parallel; and first electrodes of all unit structures are connected together, and second electrodes of all unit structures are connected together.

6. The silicon photomultiplier tube according to claim 5, wherein a voltage between the first electrode and the second electrode is tens of volts.

7. The silicon photomultiplier tube according to claim 5, wherein a number of unit structures connected in parallel in the silicon photomultiplier tube ranges from tens to tens of thousands.

8. The silicon photomultiplier tube according to claim 5, wherein a resistance of the quenching resistor ranges from tens of $\Omega$ to thousands of $\Omega$.

9. The silicon photomultiplier tube according to claim 3, wherein the deep photodiode region, the deep well region, and the unit well region are all formed through ion implantation.

10. The silicon photomultiplier tube according to claim 1, wherein the quenching resistor is composed of polysilicon resistors.

11. The silicon photomultiplier tube according to claim 1, wherein the first metal interconnect structure comprises a first contact formed in a top of the first end of the quenching resistor, a second contact formed in a top of the first electrode region, and a first metal wire connecting the first contact and the second contact.

* * * * *